(12) United States Patent
Tkachev

(10) Patent No.: US 9,466,732 B2
(45) Date of Patent: Oct. 11, 2016

(54) SPLIT-GATE MEMORY CELL WITH DEPLETION-MODE FLOATING GATE CHANNEL, AND METHOD OF MAKING SAME

(75) Inventor: Yuri Tkachev, Sunnyvale, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 369 days.

(21) Appl. No.: 13/593,460

(22) Filed: Aug. 23, 2012

(65) Prior Publication Data

US 2014/0054667 A1    Feb. 27, 2014

(51) Int. Cl.
| | |
|---|---|
| H01L 21/04 | (2006.01) |
| H01L 29/788 | (2006.01) |
| H01L 21/28 | (2006.01) |
| H01L 29/423 | (2006.01) |
| H01L 29/66 | (2006.01) |
| G11C 16/04 | (2006.01) |

(52) U.S. Cl.
CPC ....... *H01L 29/7885* (2013.01); *G11C 16/0425* (2013.01); *H01L 21/28273* (2013.01); *H01L 29/42328* (2013.01); *H01L 29/66825* (2013.01)

(58) Field of Classification Search
CPC . H01L 29/788; H01L 21/04; H01L 21/8247; H01L 29/7885; H01L 29/7883
USPC .............. 257/315, 319, E29.3, E21.04, 314; 438/265, 510
See application file for complete search history.

(56) References Cited

U.S. PATENT DOCUMENTS

| | | | |
|---|---|---|---|
| 4,145,233 A * | 3/1979 | Sefick et al. .................. 438/289 |
| 5,029,130 A | 7/1991 | Yeh | |
| 5,317,179 A * | 5/1994 | Chen .................. H01L 29/7883 |
| | | | 257/315 |
| 6,291,297 B1 * | 9/2001 | Chen .................. G11C 16/0433 |
| | | | 257/E21.209 |
| 6,747,310 B2 | 6/2004 | Fan et al. | |
| 6,902,974 B2 | 6/2005 | Ding | |
| 7,315,056 B2 * | 1/2008 | Klinger ................. H01L 27/115 |
| | | | 257/314 |
| 7,868,375 B2 | 1/2011 | Liu et al. | |

(Continued)

FOREIGN PATENT DOCUMENTS

| | | |
|---|---|---|
| JP | 03-062574 | 3/1991 |
| JP | 04-024969 | 1/1992 |

OTHER PUBLICATIONS

PCT Search Report and Written Opinion mailed on Dec. 20, 2013 corresponding to the related PCT Patent Application No. US13/52456.

(Continued)

*Primary Examiner* — Kenneth Parker
*Assistant Examiner* — Young W Kim
(74) *Attorney, Agent, or Firm* — DLA Piper LLP (US)

(57) ABSTRACT

A memory device having a substrate of semiconductor material of a first conductivity type, first and second spaced-apart regions in the substrate of a second conductivity type, with a channel region in the substrate therebetween, a conductive floating gate over and insulated from the substrate, wherein the floating gate is disposed at least partially over the first region and a first portion of the channel region, a conductive second gate laterally adjacent to and insulated from the floating gate, wherein the second gate is disposed at least partially over and insulated from a second portion of the channel region, and wherein at least a portion of the channel region first portion is of the second conductivity type.

18 Claims, 10 Drawing Sheets

(56) References Cited

U.S. PATENT DOCUMENTS

| | | |
|---|---|---|
| 7,927,994 B1 | 4/2011 | Liu et al. |
| 2005/0032306 A1 | 2/2005 | Ding |
| 2007/0097743 A1 | 5/2007 | Fang et al. |
| 2011/0127599 A1* | 6/2011 | Liu .................. H01L 21/28273 257/319 |
| 2012/0028424 A1 | 2/2012 | Shimizu |

OTHER PUBLICATIONS

Taiwanese Search Report dated Aug. 26, 2015 corresponding to the related Taiwanese Patent Application No. 102128084.

* cited by examiner

US 9,466,732 B2

SPLIT-GATE MEMORY CELL WITH DEPLETION-MODE FLOATING GATE CHANNEL, AND METHOD OF MAKING SAME

FIELD OF THE INVENTION

The present invention relates to split-gate, non-volatile Flash memory cells and methods of making the same, and more particularly memory cells having a modified conductivity type in the substrate under the floating gate.

BACKGROUND OF THE INVENTION

Split-gate non-volatile Flash memory cells having a select gate, a floating gate, a control gate and an erase gate are well known in the art. See for example U.S. Pat. Nos. 6,747,310, 7,868,375 and 7,927,994, and published application 2011/0127599, which are all incorporated herein by reference in their entirety for all purposes. Such split-gate memory cells include a channel region in the substrate that extends between the source and drain. The channel region has a first portion underneath the floating gate (hereinafter called the FG channel, the conductivity of which is controlled by the floating gate), and a second portion underneath the select gate (hereinafter the "WL channel" (wordline), the conductivity of which is controlled by the select gate).

In order to increase performance and reduce operating voltages for read, program and erase, various insulation and other thicknesses can be optimized. However, there is a need for further cell optimization not achievable by cell geometry optimization alone.

BRIEF SUMMARY OF THE INVENTION

Superior cell optimization has been achieved in a memory device having a substrate of semiconductor material of a first conductivity type, first and second spaced-apart regions in the substrate of a second conductivity type, with a channel region in the substrate therebetween, a conductive floating gate over and insulated from the substrate, wherein the floating gate is disposed at least partially over the first region and a first portion of the channel region, a conductive second gate laterally adjacent to and insulated from the floating gate, wherein the second gate is disposed at least partially over and insulated from a second portion of the channel region, and wherein at least a portion of the channel region first portion is of the second conductivity type.

A method of forming a memory device includes providing a substrate of semiconductor material of a first conductivity type, forming first and second spaced-apart regions in the substrate of a second conductivity type, with a channel region in the substrate therebetween, wherein the channel region has first and second portions, forming a region in the channel region first portion having the second conductivity type, forming a conductive floating gate over and insulated from the substrate, wherein the floating gate is disposed at least partially over the first region and the first portion of the channel region, and forming a conductive second gate laterally adjacent to and insulated from the floating gate, wherein the second gate is disposed at least partially over and insulated from the second portion of the channel region.

Other objects and features of the present invention will become apparent by a review of the specification, claims and appended figures.

DETAILED DESCRIPTION OF THE INVENTION

The present invention improves performance and endurance, including lowering operating voltages, by having the FG channel conductivity type be opposite to that of the substrate, which forms a depletion-mode FG transistor.

Figure 1:
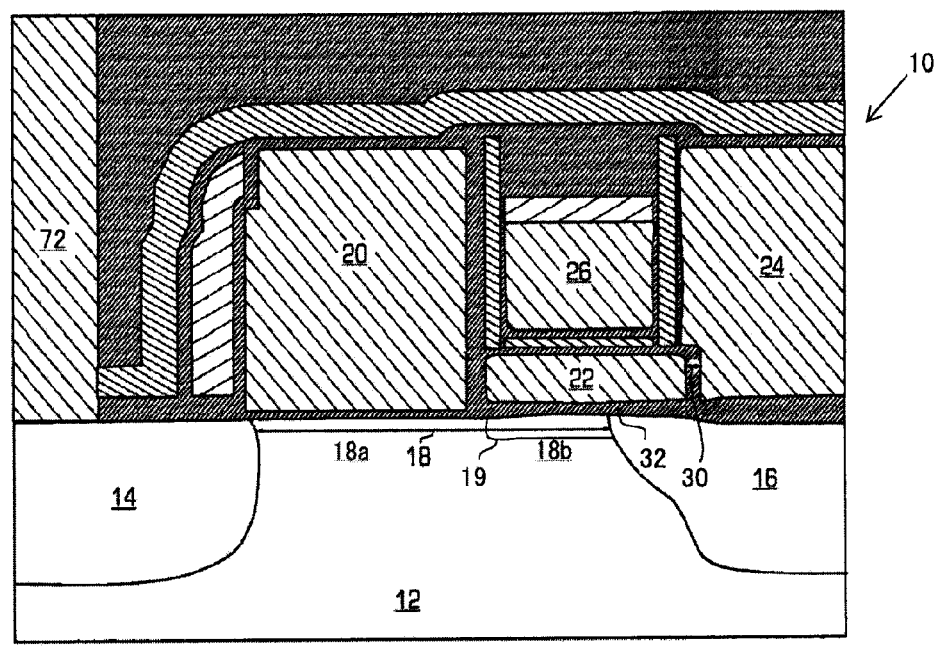
FIG. 1 is a side cross sectional view of a four-gate memory cell with the FG channel having a region of different conductivity type than the substrate.

FIG. 1 illustrates a cross-sectional view of a non-volatile memory cell 10 formed by the techniques of the present invention. While the memory cell 10 of FIG. 2 is exemplary of the type that can benefit from the techniques of the present invention, it is only one example and should not be deemed to be limiting. The memory cell 10 is made in a substantially single crystalline substrate 12, such as single crystalline silicon, which is of P conductivity type. Within the substrate 12 is a region 14 of a second conductivity type. If the first conductivity type is P then the second conductivity type is N. Spaced apart from region 14 is another region 16 of the second conductivity type. Between the regions 14 and 16 is a channel region 18 which comprises the WL channel 18a and the FG channel 18b, and which provides for the conduction of charges between region 14 and region 16. The FG channel 18b has a doped region 19 with a conductivity type opposite to that of the substrate. Therefore, for a P conductivity type substrate, region 19 in FG channel 18b is N conductivity type. As a non-limiting example, substrate 12 is P conductivity type, regions 14 and 16 are N$^+$ conductivity type, and region 19 in FG channel 18b is N$^-$ conductivity type.

Positioned above, and spaced apart and insulated from the substrate 12 is a select gate 20, also known as the word line 20. The select gate 20 is positioned over a first portion of the channel region 18 (i.e. the WL channel portion 18a). The WL channel portion 18a of the channel region 18 immediately abuts the region 14. Thus, the select gate 20 has little or no overlap with the region 14. A floating gate 22 is also positioned above and is spaced apart and is insulated from the substrate 12. The floating gate 22 is positioned over a second portion of the channel region 18 (i.e. the FG channel portion 18b) and a portion of the region 16. The FG channel portion 18b of the channel region 18 is distinct from the WL channel portion 18a of the channel region 18. Thus, the floating gate 22 is laterally spaced apart and is insulated from and is adjacent to the select gate 20. An erase gate 24 is positioned over and spaced apart from the region 16, and is insulated from the substrate 12. The erase gate 24 is laterally insulated and spaced apart from the floating gate 22. The select gate 20 is to one side of the floating gate 22, with the erase gate 24 to another side of the floating gate 22. Finally, positioned above the floating gate 22 and insulated and spaced apart therefrom is a control gate 26. The control gate 26 is positioned between and insulated from the erase gate 24 and the select gate 20.

The formation of regions 19 in the FG channel 18b with a conductivity type opposite that of the substrate 12 in which the channel region 18 is defined provides several advantages, including reduced operating voltages, wider operation windows and higher program-erase endurance.

The cycling endurance of split-gate memory cells, which utilize poly-to-poly Fowler-Nordheim electron tunneling for erase, and source-side hot electron injection for programming, is limited by the processes of electron trapping in charge-transfer dielectric layers. The cell operating window may be described as a difference of cell threshold voltages in erased and programmed state ($V_{te}$ and $V_{tp}$ correspondingly), where cell threshold voltages are measured with respect to control gate 26. Cycling-induced charge trapping in tunnel oxide 30 between the floating and erase gates 22/24 and in the floating gate oxide 32 underneath the floating gate 22 results in the shrinkage of operating window. It has been demonstrated that the reduction of operating window takes place from the "erase side", i.e. $V_{te}$ increases, while $V_{tp}$ not show a noticeable change during cycling. The cell erase performance can be characterized in terms of EG voltage, applied to a cell during erase, which is required to achieve a certain level of FG potential, or cell read current, which is considered as "1" state. This voltage will be later referred to as $V_{erase}$. During cycling $V_{erase}$ increases, and eventually may exceed the EG voltage, which is used to erase the memory array ($V_e$). This condition represents an "erase failure". Memory cell endurance capability depends on $V_e-V_{erase}$ difference. One way to improve memory cell and memory array endurance, is to reduce cell $V_{erase}$.

The present invention utilizes the method of $V_{erase}$ reduction, based on the relationship between $V_{erase}$ and floating gate threshold voltage FG $V_t$. The effect of floating gate voltage FG $V_t$ on $V_{erase}$ is expressed as $$\Delta V_{erase} = \frac{\Delta FGV_t}{1 - CR_{EG}} \quad (1)$$

where $CR_{EG}$ is EG-FG capacitive coupling coefficient. $V_{erase}$ reduces as FG $V_t$ goes lower. At typical value of $CR_{EG}=0.2$, one volt of floating gate voltage FG $V_t$ reduction results in ~1.25V of $V_{erase}$ change.

$V_{te}$ follows floating gate voltage FG $V_t$ with a $1/CR_{CG}$ factor, where $CR_{CG}$ is CG-FG capacitive coupling coefficient:

$$\Delta V_{te} = \frac{\Delta FGV_t}{CR_{CG}} \quad (2)$$

so $V_{te}$ becomes more negative as FG $V_t$ reduces.

Programming efficiency in the described cell is very high, when FG channel is conductive during programming, i.e. when the following condition apply, and virtually stops when the following condition does not apply anymore:

$$\frac{Q}{C} + \sum CR_i V_i - FGV_t = V_{SL} \quad (3)$$

where Q is the electric charge in the FG; C is the FG capacitance; $CR_i V_i$ is the product of the capacitive coupling coefficients and the voltages during programming on all the cell's nodes; $V_{SL}$ is the source (16) voltage during programming.

Assuming gate voltages during programming are constant, any change of FG $V_t$ is directly transformed into the change of FG electron charge after programming:

$$\Delta FGV_t = \frac{\Delta Q}{C} \quad (4)$$

The definition of $V_{tp}$, which is the cell's control gate voltage CG $V_t$ after programming is:

$$V_{tp} \cdot CR_{CG} + \frac{Q}{C} + V_{WL} \cdot CR_{WL} = FGV_t \quad (5)$$

where $V_{WL}$ and $CR_{WL}$ are WL voltage during cell $V_{tp}$ measurement, and WL-FG capacitive coupling coefficient respectively. From Equation (4)-(5) obtain $$V_{tp} = \frac{FGV_t - \frac{Q}{C}}{CR_{CG}} - \frac{V_{WL} \cdot CR_{WL}}{CR_{CG}} = Const(FGV_t) \quad (6)$$

which means that $V_{tp}$ does not depend on FG $V_t$: if FG $V_t$ is lower, the cell is just programmed deeper, so that $V_{tp}$ remains constant.

The above analysis shows that lowering FG $V_t$ widens the cell operating window from erase side ($V_{erase}$ reduces, $V_{te}$ becomes more negative), and does not affect the cell programming performance ($V_{tp}$ remains the same).

FIGS. 2A-2M illustrate cross-sectional views of the steps in the process to make the 4-gate non-volatile memory cell 10. Commencing with FIG. 2A, there is shown the formation N⁻ regions 19 in a substrate 12 of P type single crystalline silicon by first depositing a photoresist material (not shown) on the substrate 12, following by a masking step to form exposed selected portions of the substrate 12 through the photoresist material. Using the photoresist as a mask, the exposed portions of substrate 12 are subject to a high voltage ion implant (N⁻ type) which results in N⁻ regions 19. After the photo resist is removed, a layer of silicon dioxide 40 is formed on substrate 12. For a 90n nm (or 120 nm) process, the layer 40 of silicon dioxide can be on the order of 80-100 angstroms. Thereafter a first layer 42 of polysilicon (or amorphous silicon) is deposited or formed on the layer 40 of silicon dioxide. The first layer 42 of polysilicon can be on the order of 300-800 angstroms. The first layer 42 of polysilicon is subsequently patterned in a direction perpendicular to the select gate 20.

Figure 2A:
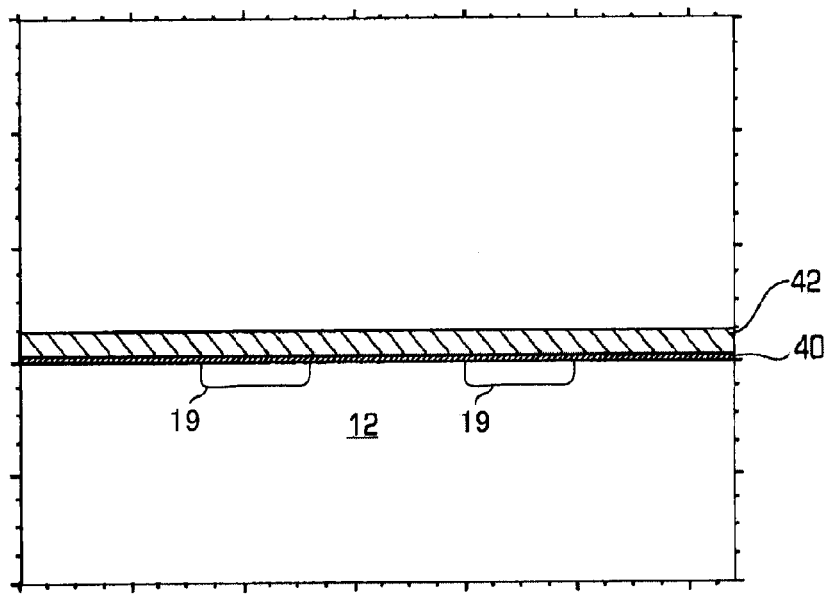
FIGS. 2A to 2M are side cross sectional views illustrating the steps in the process to make a non-volatile memory cell according the present invention.
Figure 2B:
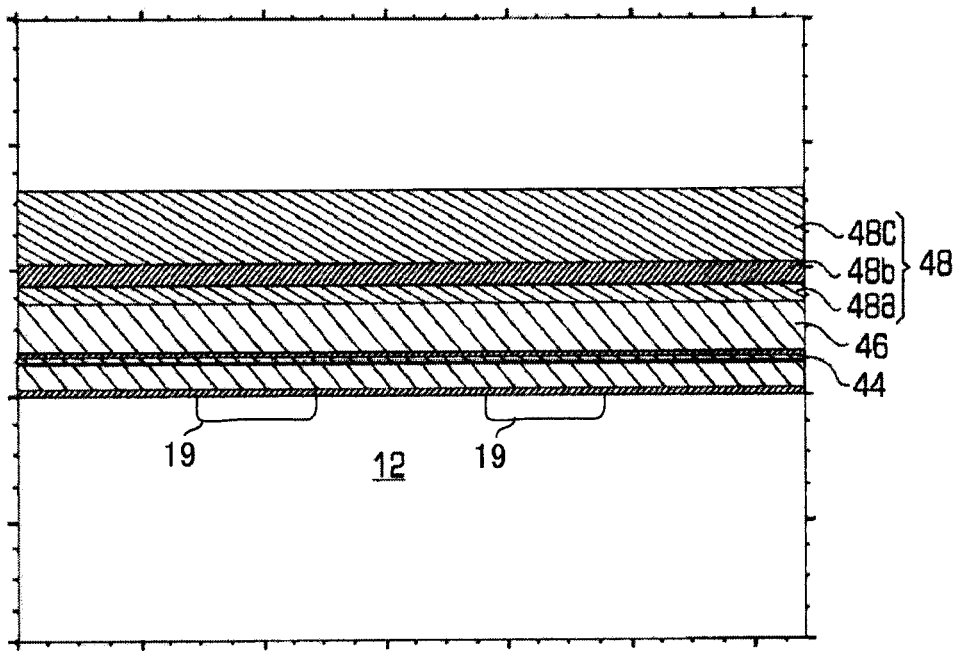

Referring to FIG. 2B, another insulating layer 44, such as silicon dioxide (or even a composite layer, such as ONO) is deposited or formed on the first layer 42 of polysilicon. Depending on whether the material is silicon dioxide or ONO, the layer 44 can be on the order of 100-200 angstroms. A second layer 46 of polysilicon is then deposited or formed on the layer 44. The second layer 46 of polysilicon can be on the order of 500-4000 angstroms thick. Another layer 48 of insulator is deposited or formed on the second layer 46 of polysilicon and used as a hard mask during subsequent dry etching. In a preferred embodiment, the layer 48 is a composite layer, comprising silicon nitride 48a, silicon dioxide 48b, and silicon nitride 48c, where the dimensions can be 200-600 angstroms for layer 48a, 200-600 angstroms for layer 48b, and 500-3000 angstroms for layer 48c.

Figure 2C:
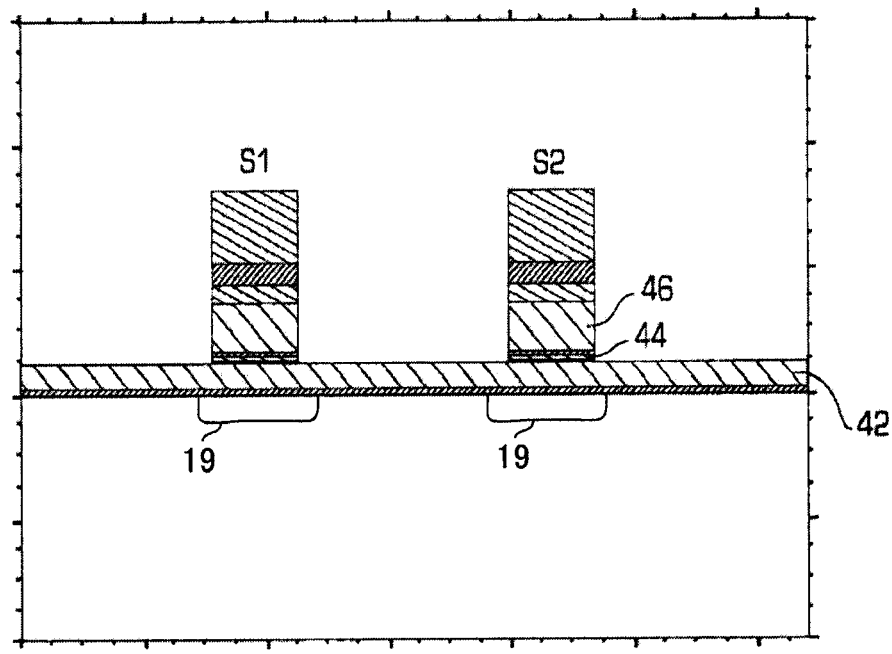

Referring to FIG. 2C, photoresist material (not shown) is deposited on the structure shown in FIG. 2B, and a masking step is formed exposing selected portions of the photoresist material. The photoresist is developed and using the photoresist as a mask, the structure is etched. The composite layer 48, the second layer 46 of polysilicon, the insulating layer 44 are then anisotropically etched, until the first layer 42 of polysilicon is exposed. The resultant structure is shown in FIG. 2C. Although only two "stacks": S1 and S2 are shown, it should be clear that there are number of such "stacks" that are separated from one another. The mask used in the above described photolithography process (to result in the structure of FIG. 2C, which dictates the formation of the control gates from layer 46), can be the same mask used for the photolithography process used to form regions 19.

Figure 2D:
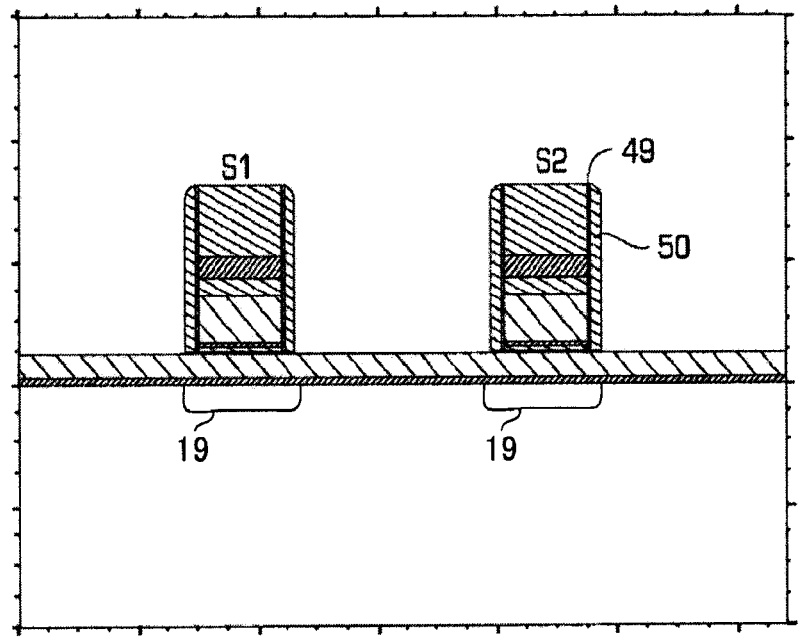

Referring to FIG. 2D, silicon dioxide 49 is deposited or formed on the structure. This is followed by the deposition of silicon nitride layer 50. The silicon dioxide 49 and silicon nitride 50 are anisotropically etched leaving a spacer 51 (which is the combination of the silicon dioxide 49 and silicon nitride 50) around each of the stacks S1 and S2. The resultant structure is shown in FIG. 2D.

Figure 2E:
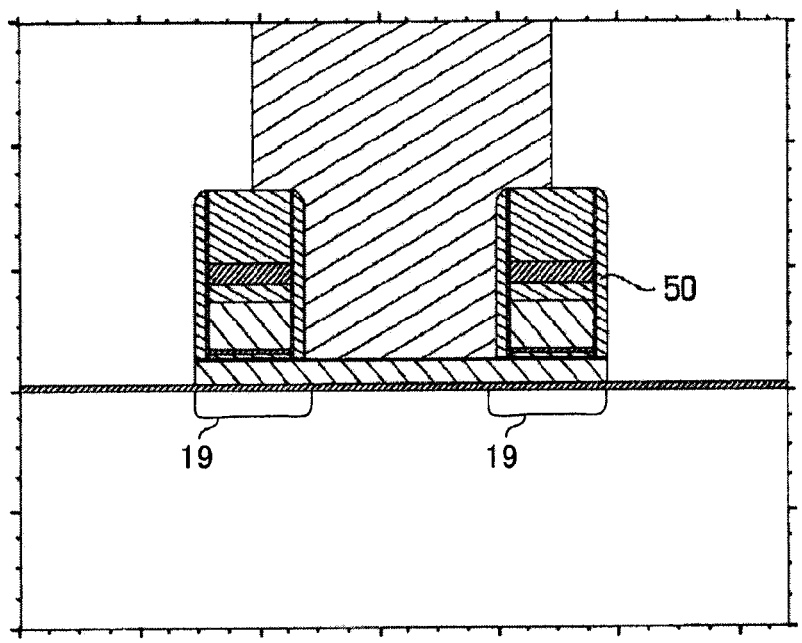

Referring to FIG. 2E, a photoresist mask is formed over the regions between the stacks S1 and S2, and other alternating pair stacks. For the purpose of this discussion, this region between the stacks S1 and S2 will be called the "inner region" and the regions not covered by the photoresist, shall be referred to as the "outer regions". The exposed first polysilicon 42 in the outer regions is anisotropically etched. The oxide layer 40 is similarly anisotropically etched. The resultant structure is shown in FIG. 2E.

Figure 2F:
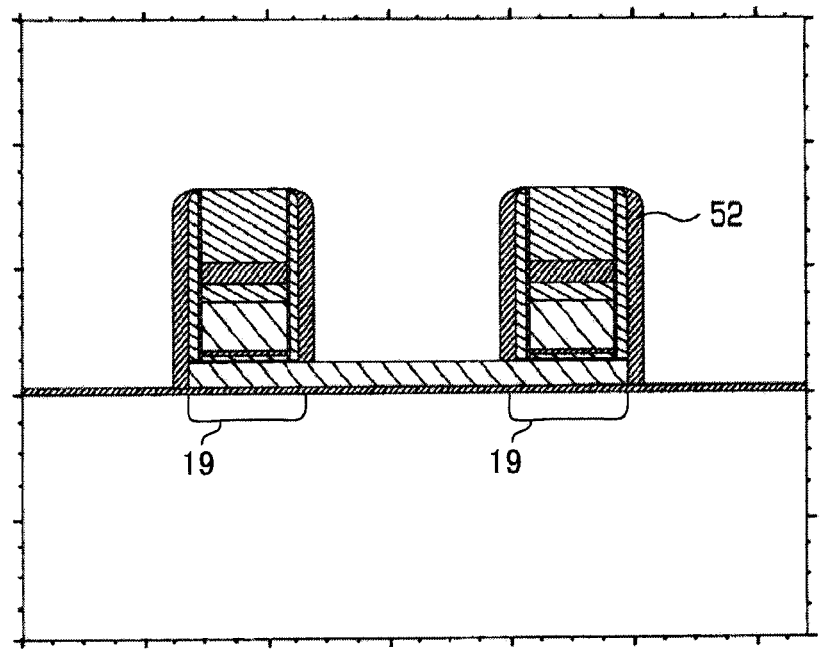

Referring to FIG. 2F, the photoresist material is removed from the structure shown in FIG. 2E. A layer of oxide 52 is then deposited or formed. The oxide layer 52 is then subject to an anisotropical etch leaving spacers 52, adjacent to the stacks S1 and S2. The resultant structure is shown in FIG. 2F.

Figure 2G:
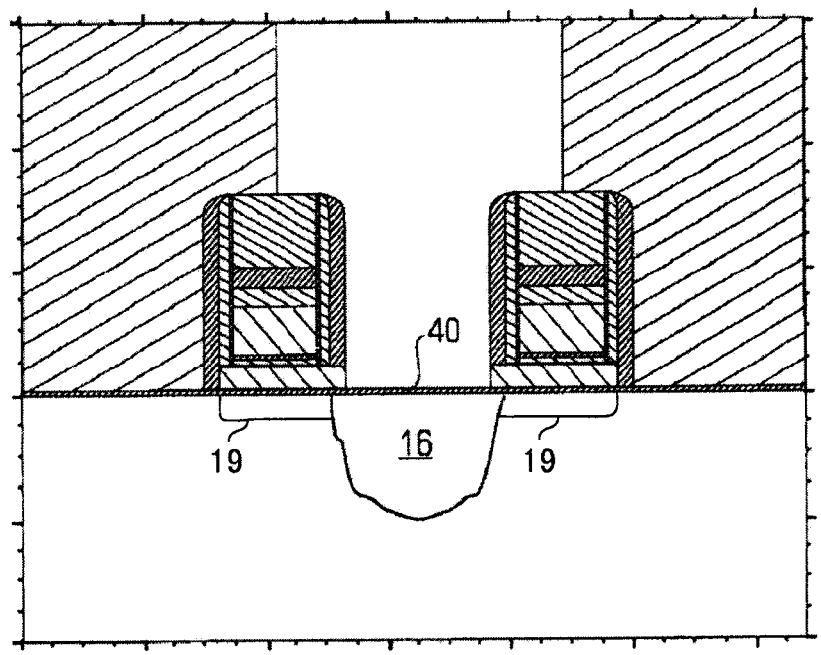

Referring to FIG. 2G, photoresist material is then deposited and is masked leaving openings in the inner regions between the stacks S1 and S2. Again, similar to the drawing shown in FIG. 2E, the photoresist is between other alternating pairs of stacks. The polysilicon 42 in the inner regions between the stacks S1 and S2 (and other alternating pairs of stacks) is anisotropically etched. The silicon dioxide layer 40 beneath the polysilicon 42 may also be anisotropically etched. The resultant structure is subject to a high voltage ion implant forming the regions 16. The resultant structure is shown in FIG. 2G.

Figure 2H:
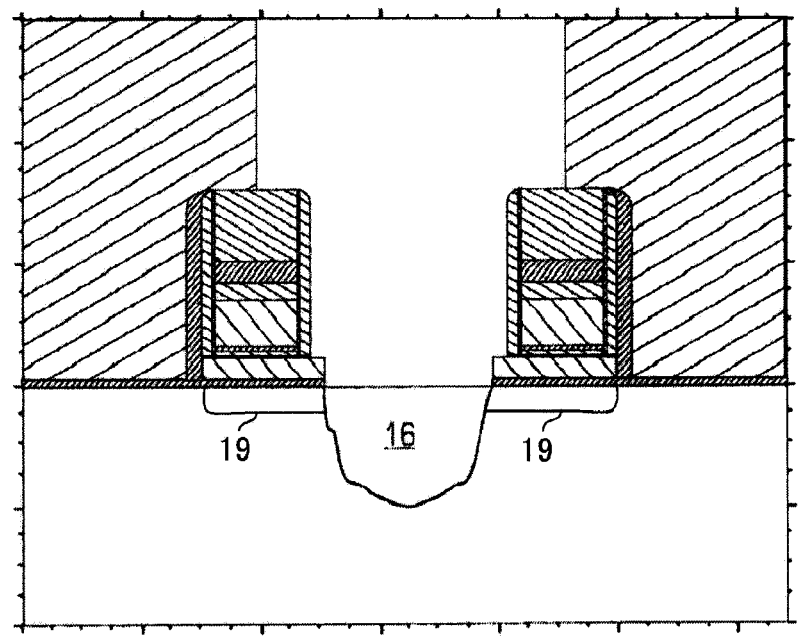
Figure 2I:
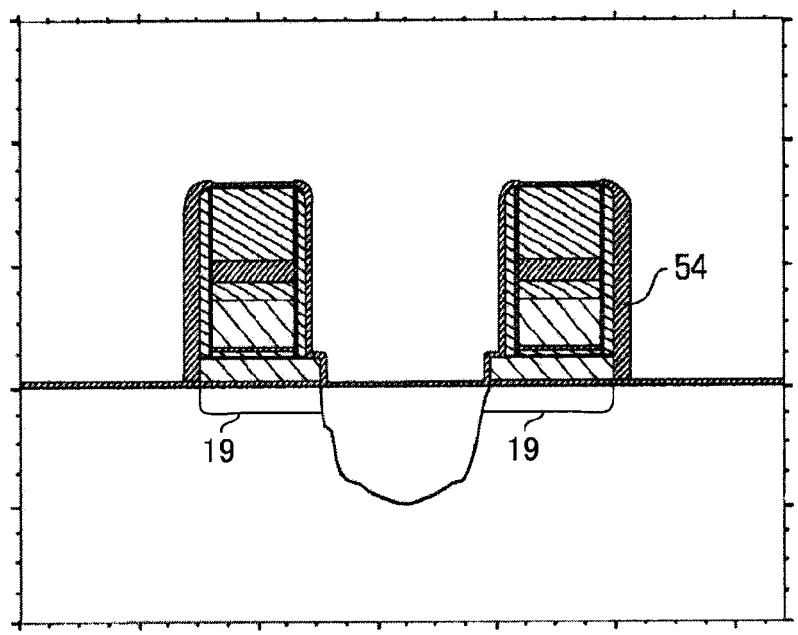

Referring to FIG. 2H, the oxide spacer 52 adjacent to the stacks S1 and S2 in the inner region is removed by e.g. a wet etch or a dry isotropic etch. Referring to FIG. 2I, the photoresist material in the outer regions of the stacks S1 and S2 is removed. Silicon dioxide 54 is deposited or formed everywhere. The resultant structure is shown in FIG. 2I.

Figure 2J:
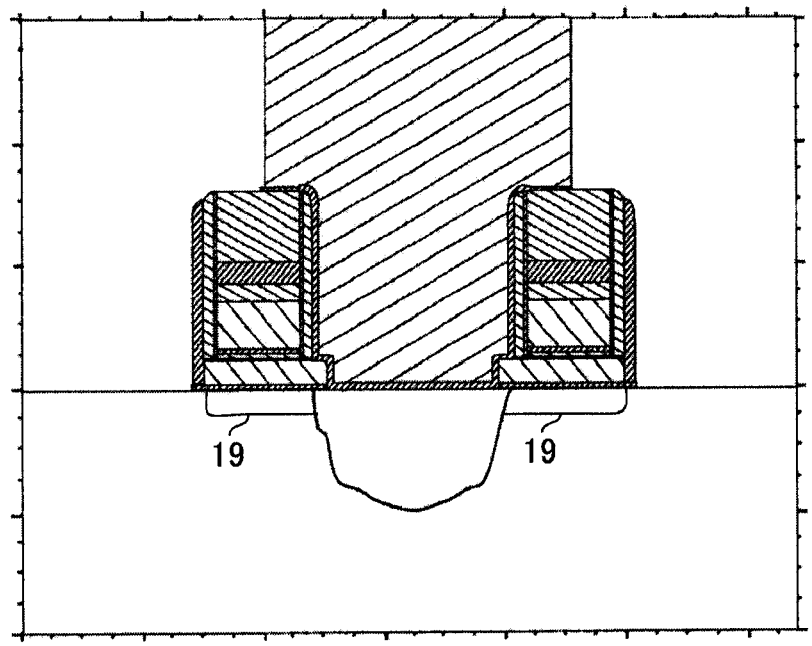

Referring to FIG. 2J, the structure is once again covered by photoresist material and a masking step is performed exposing the outer regions of the stacks S1 and S2 and leaving photoresist material covering the inner region between the stacks S1 and S2. An oxide anisotropical etch is performed, to reduce the thickness of the spacer 54 in the outer regions of the stack S1 and S2, and to completely remove silicon dioxide from the exposed silicon substrate 12 in the outer regions. The resultant structure is shown in FIG. 2J.

Figure 2K:
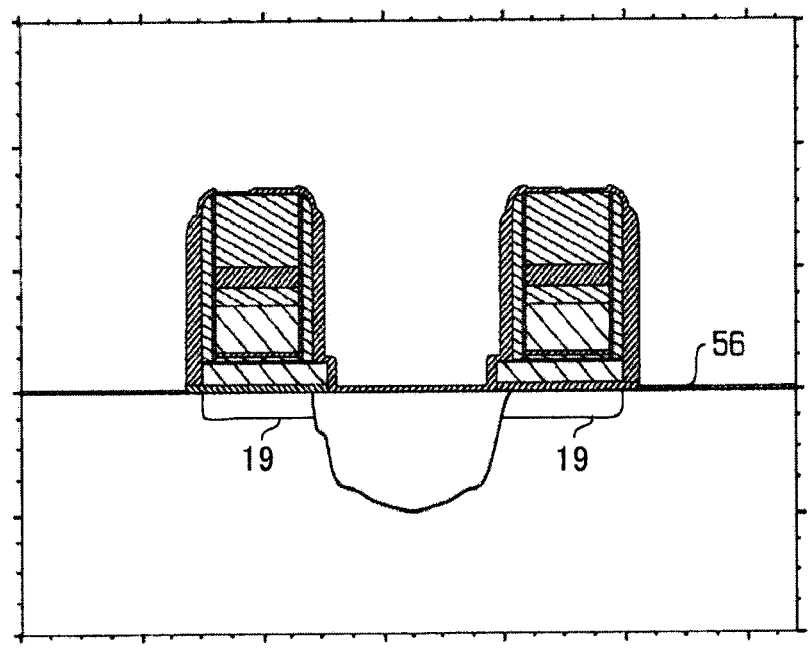
Figure 2L:
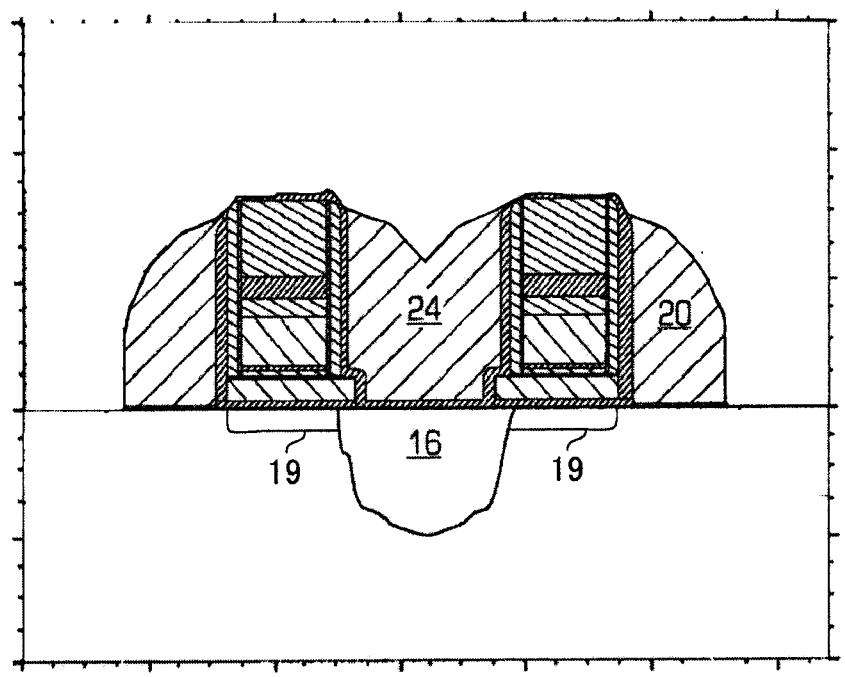

Referring to FIG. 2K, a thin layer 56 of silicon dioxide is formed on the structure. This oxide layer 56 is the gate oxide between the select gate and the substrate 12. Referring to FIG. 2L, polysilicon is deposited everywhere, which is then subject to an anisotropical etch forming spacers in the outer regions of the stack S1 and S2 which form the select gates 20 of two memory cells 10 adjacent to one another sharing a common region 16. In addition, the spacers within the inner regions of the stacks S1 and S2 are merged together forming a single erase gate 24 which is shared by the two adjacent memory cells 10.

Figure 2M:
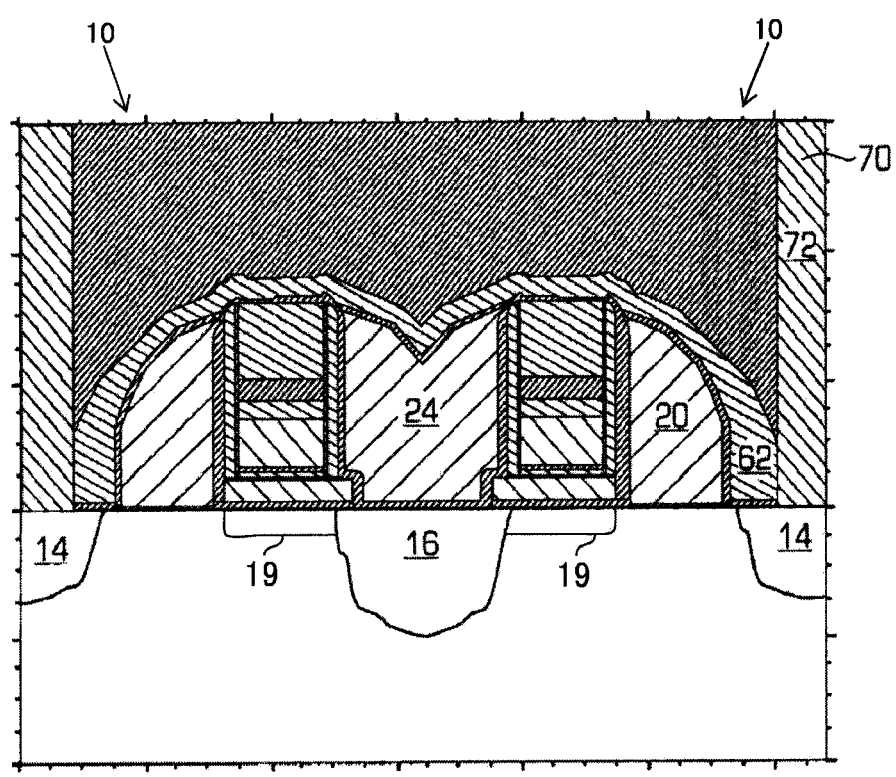

Referring to FIG. 2M, a layer of insulator 62 is deposited on the structure, and etched anisotropically to form spacers 62 next to the select gates 20. Insulator 62 can be a composite layer comprising silicon dioxide and silicon nitride. Thereafter, an ion implant step is performed forming the regions 14. Each of these memory cells on another side share a common region 14. Insulators and metallization layers are subsequently deposited and patterned to form bit line 70 and bit line contacts 72. The operations of program, read and erase and in particular the voltages to be applied may be the same as those as set forth in U.S. Pat. No. 6,747,310, whose disclosure has been incorporated herein by reference in its entirety. The resulting memory cells 10 are illustrated in FIG. 2M.

Figure 3:
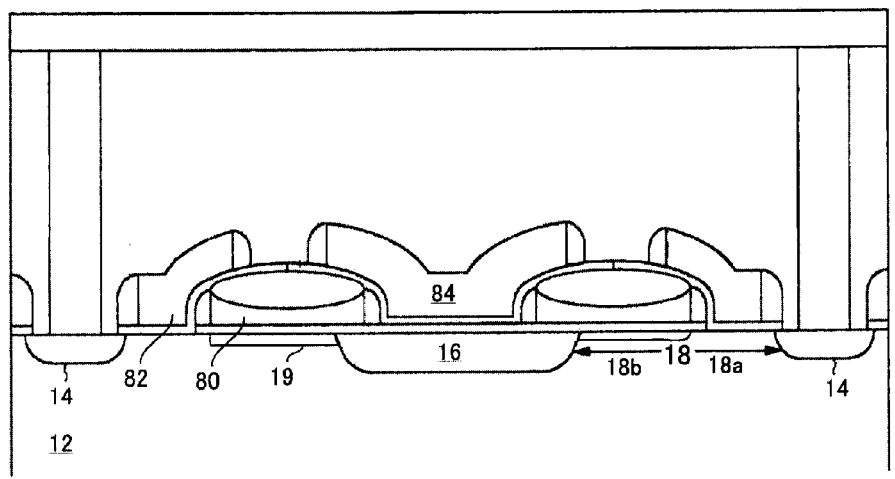
FIG. 3 is a side cross sectional view of a three-gate memory cell with the FG channel having a region of different conductivity type than the substrate.

The formation of regions 19 in the FG channel can be implemented in other split-gate memory cell configurations. For example, U.S. Pat. No. 7,315,056 discloses a split-gate memory cell with three gates (a floating gate, a control gate and a program/erase gate), and is incorporated herein by reference in its entirety for all purposes. FIG. 3 illustrates the three-gate memory cell modified to include regions 19 in the FG channel. Specifically, this memory cell configuration includes the floating gate 80, control gate 82 laterally adjacent to the floating gate 80 and extending up and over floating 80, and a program/erase gate 84 on the other side of floating gate 80 and extending up and over floating gate 80. With this cell design, due to higher coupling between the control and floating gates, the effect of the floating gate voltage FG Vt on $V_{erase}$ is even stronger by adding region 19 to the FG channel region. The effect of the floating gate voltage FG Vt on the program operation is similar. Programming effectively stops at a certain value of surface potential, so the cell will program deeper at a lower floating gate voltage FG Vt:

$$\Delta FGV_t = \frac{\Delta Q}{C} \qquad (7)$$

By adding region 19, it is also possible to reduce the overlap of the source 16 and the floating gate, for better scaling to smaller cell dimensions.

Figure 4:
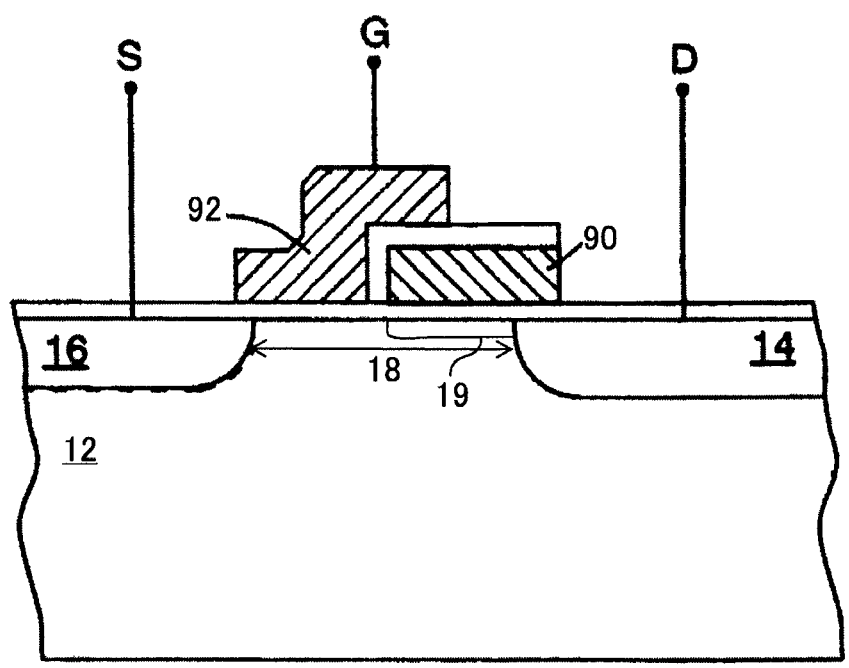
FIG. 4 is a side cross sectional view of a two-gate memory cell with the FG channel having a region of different conductivity type than the substrate.

U.S. Pat. No. 5,029,130 discloses a split-gate memory cell with two gates (a floating gate and a control gate), and is incorporated herein by reference in its entirety for all purposes. FIG. 4 illustrates the two-gate memory cell modified to include regions 19 in the FG channel. Specifically, this memory cell configuration includes the floating gate 90 and a control gate 92 laterally adjacent to the floating gate 90 and extending up and over floating 90. The addition of region 19 reduces operating voltages and increases the cell operating window.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. For example, instead of performing a selective N-type implantation to form regions 19 in substrate 12, the entire substrate 12 could be subjected to N-type implantation, followed by a selective P-type implantation after the floating gates are formed in a manner where N-type implantation under the floating gates are preserved, to result in a P-type substrate with N-type regions 19. Additionally, the substrate could be n-type with regions 19 being p-type. Further, as is apparent from the claims and specification, not all method steps need be performed in the exact order illustrated or claimed, but rather in any order that allows the proper formation of the memory cell of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A memory device, comprising:
   a substrate of semiconductor material of a first conductivity type;
   first and second spaced-apart regions in the substrate of a second conductivity type, with a channel region in the substrate therebetween;
   a conductive floating gate over and insulated from the substrate, wherein the floating gate is disposed partially over the first region and over a first portion of the channel region;
   a conductive second gate laterally adjacent to and insulated from the floating gate, wherein the second gate is disposed partially or fully over and insulated from a second portion of the channel region;
   wherein some or all of the first portion of the channel region is of the second conductivity type, and wherein the second portion of the channel region is entirely of the first conductivity type.

2. The memory device of claim 1, wherein the second gate has a first portion laterally adjacent to and insulated from the floating gate, and a second portion that extends up and over, and insulated from, the floating gate.

3. The memory device of claim 1, further comprising:
   a conductive program/erase gate laterally to one side of, and insulated from, the floating gate, wherein the program/erase gate is disposed partially or fully over and insulated from the first region; and
   the second gate is laterally to an opposite side of the one side of, and insulated from, the floating gate.

4. The memory device of claim 1, further comprising:
   a conductive control gate over and insulated from the floating gate;
   a conductive erase gate laterally to one side of, and insulated from, the floating gate, wherein the erase gate is disposed partially or fully over and insulated from the first region; and
   the second gate is laterally to an opposite side of the one side of, and insulated from, the floating gate.

5. The memory device of claim 1, wherein the first conductivity type is P conductivity type, and the second conductivity type is N conductivity type.

6. The memory device of claim 5, wherein the first and second regions are N+ conductivity type, and the first portion of the channel region is N– conductivity type.

7. A method of forming a memory device, comprising:
   providing a substrate of semiconductor material of a first conductivity type;
   forming first and second spaced-apart regions in the substrate of a second conductivity type, with a channel region in the substrate therebetween, wherein the channel region has first and second portions;
   forming a region in the first portion of the channel region having the second conductivity type;
   forming a conductive floating gate over and insulated from the substrate, wherein the floating gate is disposed partially over the first region and over the first portion of the channel region;
   forming a conductive second gate laterally adjacent to and insulated from the floating gate, wherein the second gate is disposed partially or fully over and insulated from the second portion of the channel region;
   wherein the second portion of the channel region is entirely of the first conductivity type.

8. The method of claim 7, wherein the second gate has a first portion laterally adjacent to and insulated from the floating gate, and a second portion that extends up and over, and insulated from, the floating gate.

9. The method of claim 7, further comprising:
   forming a conductive program/erase gate laterally to one side of, and insulated from, the floating gate, wherein the program/erase gate is disposed partially or fully over and insulated from the first region; and
   the second gate is laterally to an opposite side of the one side of, and insulated from, the floating gate.

10. The method of claim 7, further comprising:
    forming a conductive control gate over and insulated from the floating gate;
    forming a conductive erase gate laterally to one side of, and insulated from, the floating gate, wherein the erase gate is disposed partially or fully over and insulated from the first region; and
    the second gate is laterally to an opposite side of the one side of, and insulated from, the floating gate.

11. The method of claim 7, wherein forming of the conductive control gate and the forming of the region in the first portion of the channel region are performed using the same photolithography mask.

12. The method of claim 7, wherein the forming of the region in the first portion of the channel region having the second conductivity type comprises:
   implanting a dopant of the second conductivity type into the region in the first portion of the channel region.

13. The method of claim 7, wherein the first conductivity type is P conductivity type, and the second conductivity type is N conductivity type.

14. The method of claim 13, wherein the forming of the region in the first portion of the channel region having the second conductivity type comprises:
   implanting an N conductivity type dopant into the region in the first portion of the channel region.

15. The method of claim 13, wherein the forming of the region in the first portion of the channel region having the second conductivity type comprises:
   implanting an N conductivity type dopant into the substrate; and
   implanting a P conductivity type dopant into the substrate in a manner that excludes the region in the first portion of the channel region.

16. The method of claim 13, wherein the first and second regions are N+ conductivity type, and the first portion of the channel region is N− conductivity type.

17. The method of claim 16, wherein the forming of the region in the first portion of the channel region having the second conductivity type comprises:
   implanting an N− conductivity type dopant into the region in the first portion of the channel region.

18. The method of claim 16, wherein the forming of the region in the first portion of the channel region having the second conductivity type comprises:
   implanting an N− conductivity type dopant into the substrate; and
   implanting a P conductivity type dopant into the substrate in a manner that excludes the region in the first portion of the channel region.

\* \* \* \* \*